United States Patent
Jang et al.

(10) Patent No.: US 6,653,889 B2
(45) Date of Patent: Nov. 25, 2003

(54) VOLTAGE GENERATING CIRCUITS AND METHODS INCLUDING SHARED CAPACITORS

(75) Inventors: Seong-Jin Jang, Gyeonggi-do (KR); Young-Hyun Jun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/188,927

(22) Filed: Jul. 2, 2002

(65) Prior Publication Data

US 2003/0020534 A1 Jan. 30, 2003

(30) Foreign Application Priority Data

Jul. 26, 2001 (KR) .................................. 2001-0045256

(51) Int. Cl.[7] ................................................. G05F 1/10
(52) U.S. Cl. ....................................................... 327/536
(58) Field of Search ................................ 327/530, 534, 327/535, 536

(56) References Cited

U.S. PATENT DOCUMENTS

| | | |
|---|---|---|
| 5,677,645 A | * 10/1997 | Merritt ........................ 327/536 |
| 5,796,293 A | 8/1998 | Yoon et al. |
| 6,052,022 A | 4/2000 | Lee |

* cited by examiner

Primary Examiner—Jeffrey Zweizig
(74) Attorney, Agent, or Firm—Myers Bigel Sibley & Sajovec

(57) ABSTRACT

Integrated circuit voltage generating circuits include an integrated circuit substrate, a first voltage generating circuit in the integrated substrate that is configured to generate a first voltage from a power supply voltage, and a second voltage generating circuit in the integrated circuit substrate that is configured to generate a second voltage that is different from the first voltage from the power supply voltage. A shared capacitor in the integrated circuit substrate is connected to both the first voltage generating circuit and to the second voltage generating circuit. The shared capacitor is used by the first voltage generating circuit and the second voltage generating circuit, to generate the first and second voltages.

21 Claims, 9 Drawing Sheets

VOLTAGE GENERATING CIRCUITS AND METHODS INCLUDING SHARED CAPACITORS

RELATED APPLICATION

This application claims the benefit of Korean Patent Application No. 2001-45256, filed Jul. 26, 2001, the disclosure of which is hereby incorporated herein by reference in its entirety as if set forth fully herein.

FIELD OF THE INVENTION

The present invention relates to integrated circuit devices and operating methods, and more particularly to integrated circuit voltage generating circuits and methods.

DESCRIPTION OF RELATED ART

Integrated circuit devices are widely used in consumer and commercial applications. Many integrated circuit devices, such as integrated circuit memory devices, employ a high voltage and a low voltage in the integrated circuit, which are generated in the integrated circuit from one or more power supply voltages that are provided to the integrated circuit. For example, many integrated circuit devices include a high voltage generating circuit, which generates a high voltage and a low voltage generating circuit, which generates a low voltage. See, for example, U.S. Pat. Nos. 6,052,022 and 5,796,293 that are assigned to the assignee of the present application, the disclosures of which are hereby incorporated herein by reference in their entirety as if set forth fully herein. A first pumping capacitor may be used for pumping the high voltage and a second, separate pumping capacitor may be used for pumping the low voltage.

FIG. 1 is a block diagram illustrating a conventional voltage generating circuit. The voltage generating circuit of FIG. 1 separately includes a high voltage control signal generating circuit 10, a high voltage generating circuit 12, a low voltage control signal generating circuit 20, and a low voltage generating circuit 22.

The high voltage control signal generating circuit 10 generates a high voltage control signal VPPEN in response to a high voltage enable signal VPEN. The high voltage generating circuit 12 generates a high voltage VPP in response to the high voltage control signal VPPEN. The low voltage control signal generating circuit 20 generates a low voltage control signal VBBEN in response to a low voltage enable signal VBEN. The low voltage generating circuit 22 generates a low voltage VBB in response to the low voltage control signal VBBEN.

The conventional voltage generating circuit of FIG. 1 includes the high voltage generating circuit and the low voltage generating circuit which are separately configured. Even though not shown, separate pumping capacitors are configured in the high voltage generating circuit and the low voltage generating circuit, respectively.

SUMMARY OF THE INVENTION

Some embodiments of the present invention provide integrated circuit voltage generating circuits that include an integrated circuit substrate, a first voltage generating circuit in the integrated substrate that is configured to generate a first voltage from a power supply voltage, and a second voltage generating circuit in the integrated circuit substrate that is configured to generate a second voltage that is different from the first voltage from the power supply voltage. A shared capacitor in the integrated circuit substrate is connected to both the first voltage generating circuit and to the second voltage generating circuit. The shared capacitor, also referred to as a pumping capacitor or a shared pumping capacitor, is used by the first voltage generating circuit and the second voltage generating circuit, to generate the first and second voltages, respectively. Accordingly, in some embodiments of the present invention, the layout area of an integrated circuit voltage generating circuit in an integrated circuit substrate may be reduced by sharing a pumping capacitor by the first and second voltage generating circuits.

In some embodiments of the present invention, the first voltage generating circuit includes a plurality of capacitors and the shared capacitor is of larger capacitance than any of the plurality of capacitors. In other embodiments, the first voltage generating circuit includes a first transistor and generates the first voltage at a first node. The second voltage generating circuit includes a second transistor and generates the second voltage at a second node. The first transistor, the shared capacitor and the second transistor are serially connected between the first node and the second node. In yet other embodiments, the first voltage is of opposite polarity than the power supply voltage and the second voltage is of same polarity as, but greater than, the power supply voltage. In still other embodiments, the first voltage and second voltage are used with a memory cell array in the integrated circuit substrate. The memory cell array operates from the power supply voltage, the first voltage and the second voltage.

Other embodiments of the present invention provide a voltage generating circuit, comprising: control signal generating means for generating high and low voltage control signals for interleavingly toggling high and low enable signals when the high and the low voltages are all enabled, for generating the high voltage control signal for toggling the high voltage enable signal when the high voltage enable signal is enabled, and for generating the low voltage control signal for toggling the low voltage enable signal when the low voltage enable signal is enabled. Voltage generating means also is provided for pre-charging high and low voltage pumping nodes during a pre-charge operation in response to the high and the low voltage control signals, respectively, for pumping a pumping capacitor connected between the high and the low pumping nodes to generate a low voltage during a low voltage generating operation in response to the low voltage control signal, and for pumping the pumping capacitor to generate a high voltage during a high voltage generating operation in response to the high voltage control signal.

Other voltage generating circuits according to other embodiments of the invention include control signal generating means for generating high and low voltage control signals for interleavingly toggling high and low voltage enable signals when the high and the low voltage enable signals are all enabled, for generating the high voltage control signal for toggling the high voltage enable signal when the high voltage enable signal is enabled, and for generating the low voltage control signal for toggling the low voltage enable signal when the low voltage enable signal is enabled. Low voltage control means also is included for generating a low voltage generating control signal to a low voltage generating control node in response to the high voltage control signal and for generating first and second pre-charge control signals respectively applied to first and second pre-charge nodes by combining the high and the low voltage control signals. High voltage control means also is included for generating a high voltage generating control signal to a high voltage generating control node in response to the low voltage control signal and for generating third and fourth pre-charge control signals respectively applied to third and fourth pre-charge nodes by combining the high and the low voltage control signals. Low voltage generating means is provided for pre-charging the low voltage pumping node in response to the first and the second pre-charge control signals during the pre-charge operation, for transmitting a voltage of the low voltage pumping node to a low voltage generating terminal in response to the low voltage control signal during the low voltage generating operation, and for pumping the high voltage by pumping the pumping capacitor in response to the low voltage control signal during the high voltage generating operation. Finally, a high voltage generating means is included for pre-charging the high voltage pumping node in response to the third and the fourth pre-charge control signals during the pre-charge operation, for transmitting a voltage of the high voltage pumping node to a high voltage generating terminal in response to the high voltage control signal during the high voltage generating operation, and for pumping the low voltage by pumping the pumping capacitor in response to the high voltage control signal during the low voltage generating operation.

Other embodiments of the present invention provide voltage generating methods. A high voltage pumping node is stepped up by pumping a pumping capacitor connected between the high voltage pumping node and a low voltage pumping node in response to a high voltage control signal during a high voltage generating operation. The high and the low voltage pumping nodes, respectively, are pre-charged during a pre-charge operation. A voltage of the low voltage pumping node is stepped down by pumping the pumping capacitor in response to a low voltage control signal during a low voltage generating operation. A voltage of the low voltage pumping node is transmitted to a low voltage generating terminal.

Other voltage generating methods, according to embodiments of the invention, step up a voltage of a high voltage pumping node by pumping a pumping capacitor connected between the high voltage pumping node and a low voltage pumping node in response to a high voltage control signal during a high voltage generating operation, and transmit the voltage of the high voltage pumping node to a high voltage generating terminal. The high and the low voltage pumping nodes, respectively, are pre-charged during a pre-charge operation. The stepping and pre-charging are performed repeatedly.

Still other voltage generating methods, according to embodiments of the invention, comprise stepping down a voltage of the low voltage pumping node by pumping the pumping capacitor in response to a low voltage control signal during a low voltage generating operation, and transmitting a voltage of the low voltage pumping node to a low voltage generating terminal. The high and the low voltage pumping nodes, respectively, are pre-charged during a pre-charge operation. The stepping and pre-charging are performed repeatedly.

DETAILED DESCRIPTION OF THE PREFERRED EMBODIMENT

Figure 1:
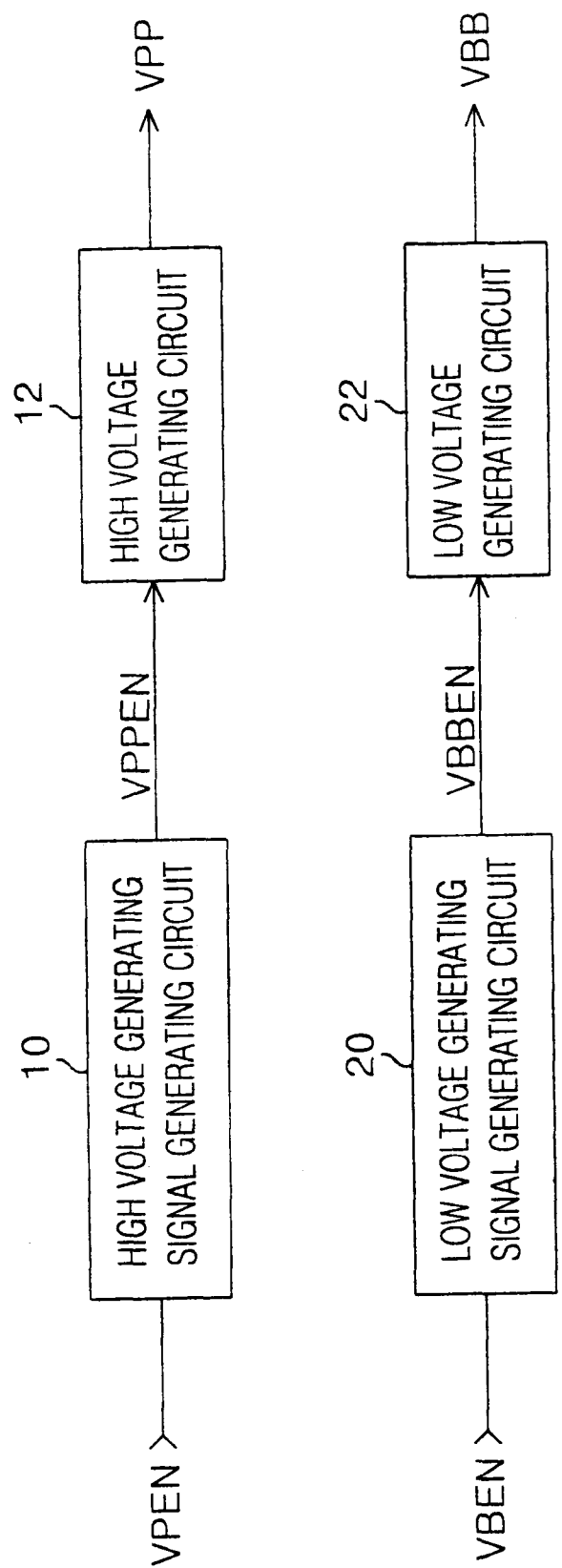
FIG. 1 is a block diagram illustrating a conventional voltage generating circuit.

The present invention now will be described more fully hereinafter with reference to the accompanying figures, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element, such as a layer, region or substrate, is referred to as being "on" another element, it can be directly on the other element or intervening elements may also be present. In contrast, when an element, such as a layer, region or substrate, is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly coupled" to another element, there are no intervening elements present.

Figure 2:
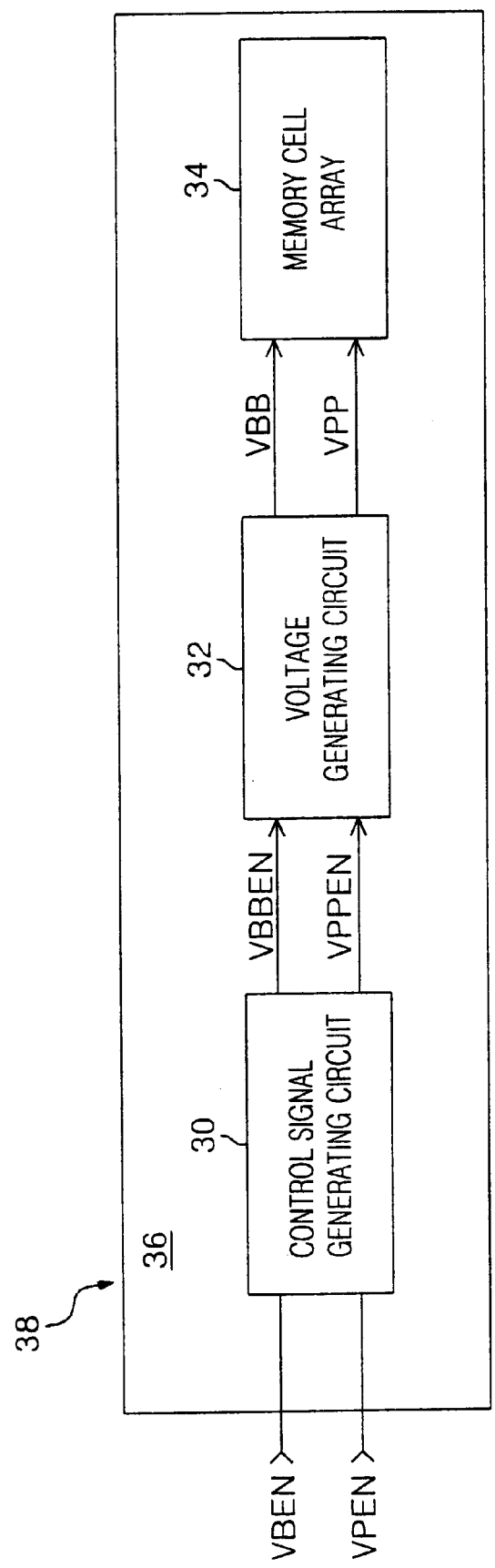
FIG. 2 is a block diagram illustrating voltage generating circuits according to some embodiments of the present invention.

FIG. 2 is a block diagram illustrating voltage generating circuits according to some embodiments of the present invention. Embodiments of FIG. 2 are illustrated in the environment of an integrated circuit memory device 38. However, it will be understood that embodiments of the invention may be used with other integrated circuit devices.

Referring to FIG. 2, the integrated circuit memory device 38 includes an integrated circuit substrate 36. The voltage generating circuit of FIG. 2 includes a control signal generating circuit 30 and a voltage generating circuit 32 in the integrated circuit substrate 36.

The control signal generating circuit 30 generates a low voltage control signal VBBEN and a high voltage control signal VPPEN by combining a low voltage enable signal VBEN and a high voltage enable signal VPEN. The voltage generating circuit 32 pumps a low voltage VBB in response to the low voltage control signal VBBEN and pumps a high voltage VPP in response to the high voltage control signal VPPEN. The low voltage VBB and the high voltage VPP may be used to operate a memory cell array 34 and/or other active circuitry, in the integrated circuit substrate 36.

Figure 3:
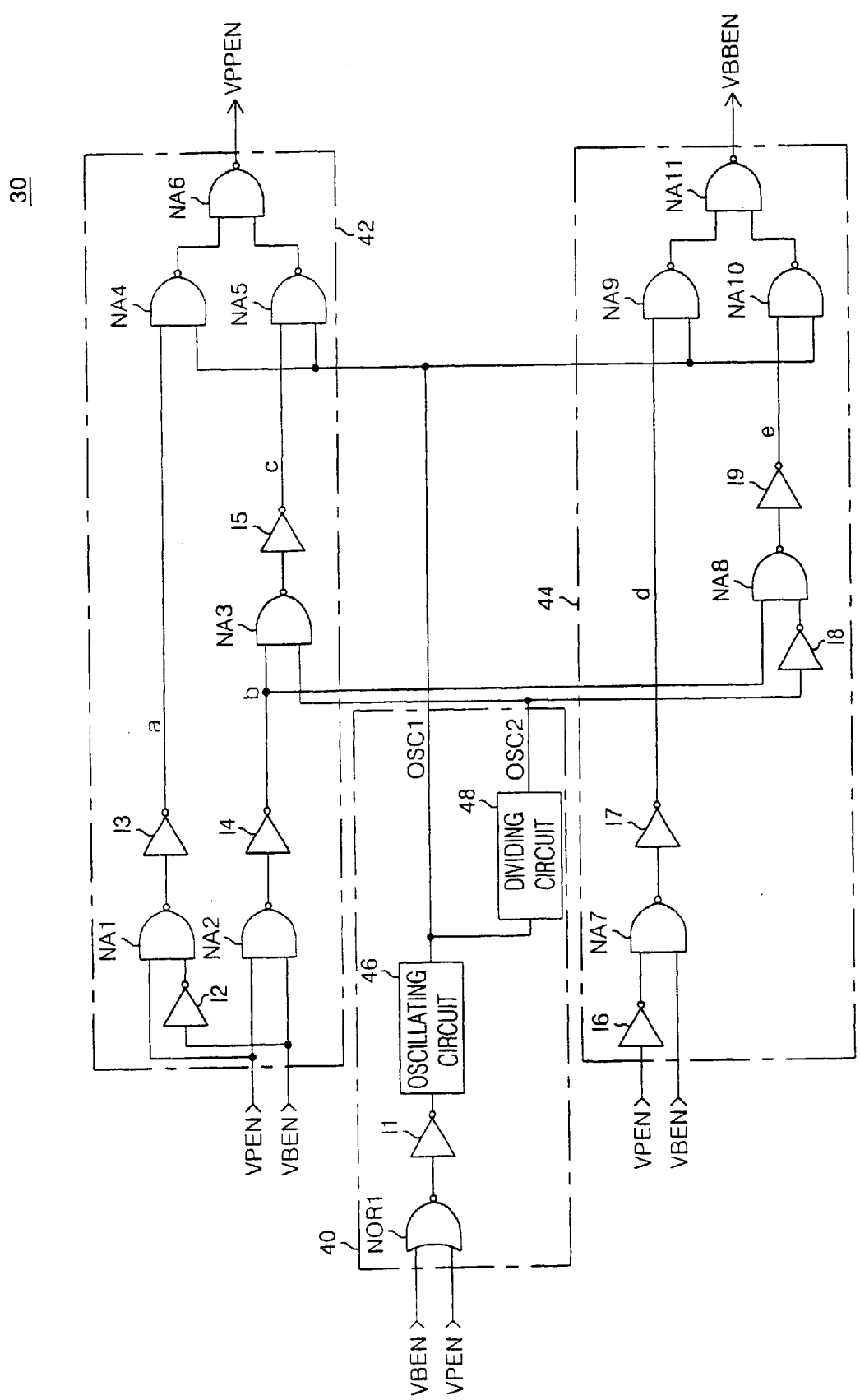
FIG. 3 is a circuit diagram illustrating a control signal generating circuit such as may be used in FIG. 2 according to some embodiments of the present invention.

FIG. 3 is a circuit diagram illustrating a control signal generating circuit, such as the control signal generating circuit 30 of FIG. 2. The control signal generating circuit 30 includes pulse signal generating means 40, high voltage control signal generating means 42, and low voltage control signal generating means 44.

The pulse signal generating means 40 includes a NOR gate NOR1, an inverter I1, an oscillating circuit 46 and a dividing circuit 48. The high voltage control signal generating means 42 includes inverters I2 to I5 and NAND gates NA1 to NA6. The low voltage control signal generating means 44 includes inverters I6 to I9 and NAND gates NA7 to NA11.

The NOR gate NOR1 and the inverter I1 generate a signal having a logic "high" level when the low voltage enable signal VBEN having a logic "high" level or the high voltage enable signal VPEN having a logic "high" level is applied. The oscillating circuit 46 generates a pulse signal OSC1 in response to an output signal having a logic "high" level of the inverter I1. The dividing circuit 48 divides two into a frequency of an output signal of the oscillating circuit 46 to generate the divided pulse signal OSC2. The inverter I2 inverts the low voltage enable signal VBEN. The NAND gate NA1 and the inverter I3 generate a signal "a" having a logic "high" level by ANDing the low voltage enable signal VBEN having a logic "low" level and the high voltage enable signal VPEN having a logic "high" level. The NAND gate NA2 and the inverter I4 generate a signal "b" having a logic "high" level by ANDing the low voltage enable signal VBEN having a logic "high" level and the high voltage enable signal VPEN having a logic "high" level. The NAND gate NA3 and the inverter I5 receive the signal OSC2 to output a signal "c" in response to the signal "b" having a logic "high" level. The NAND gate NA4 NANDs the signals "a" and OSC1. The NAND gate NA5 NANDs the signals "c" and OSC1. The NAND gate NA6 generates the high voltage control signal VPPEN by NANDing output signals of the NAND gates NA4 and NA5. The inverter I6 inverts the high voltage enable signal VPEN. The NAND gate NA7 and the inverter I7 generate a signal "d" by NANDing an output signal having a logic "high" level of the inverter I6 and the low voltage enable signal VBEN. The inverter I8 inverts the signal OSC2. The NAND gate NA8 and the inverter I9 receive an output signal of the inverter I8 to generate a signal "e" in response to the signal "b" having a logic "high" level. The NAND gate NA9 NANDs the signals "d" and OSC1. The NAND gate NA11 generates the low voltage control signal VBBEN by NANDing output signals of the NAND gates NA9 and NA10.

Figure 4A:
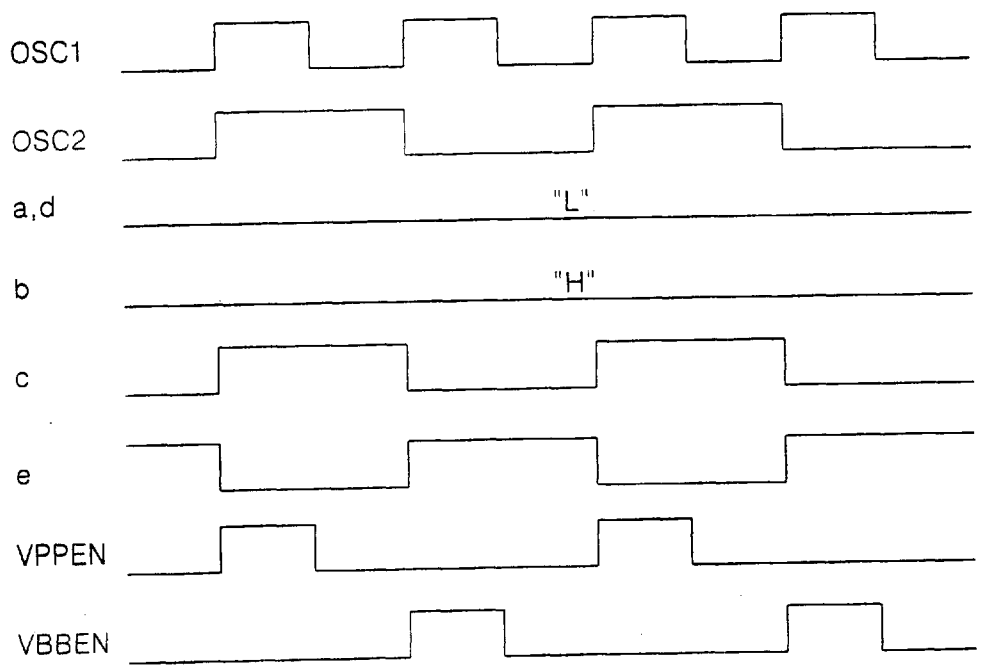
FIGS. 4A–4C are timing diagrams to describe an operation of a control signal generating circuit, such as the circuit of FIG. 3, according to some embodiments of the present invention.
Figure 4B:
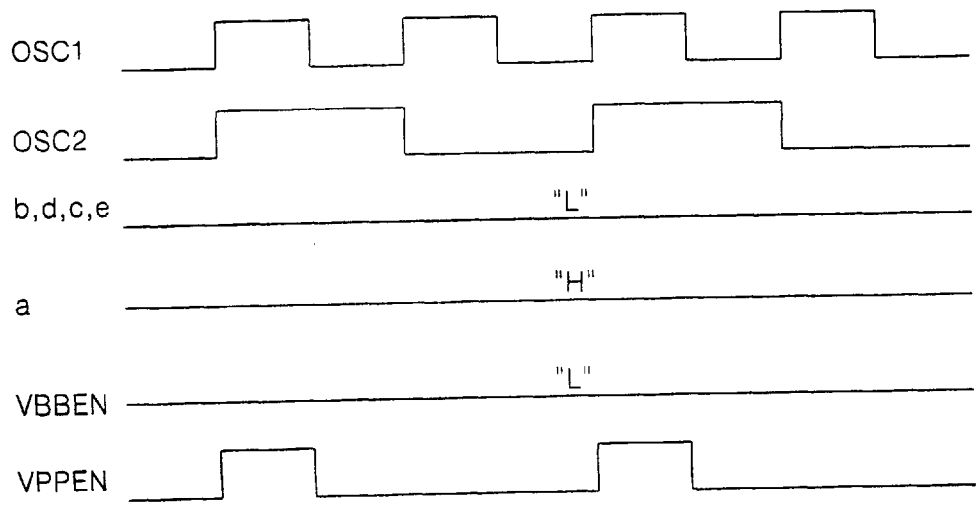
Figure 4C:
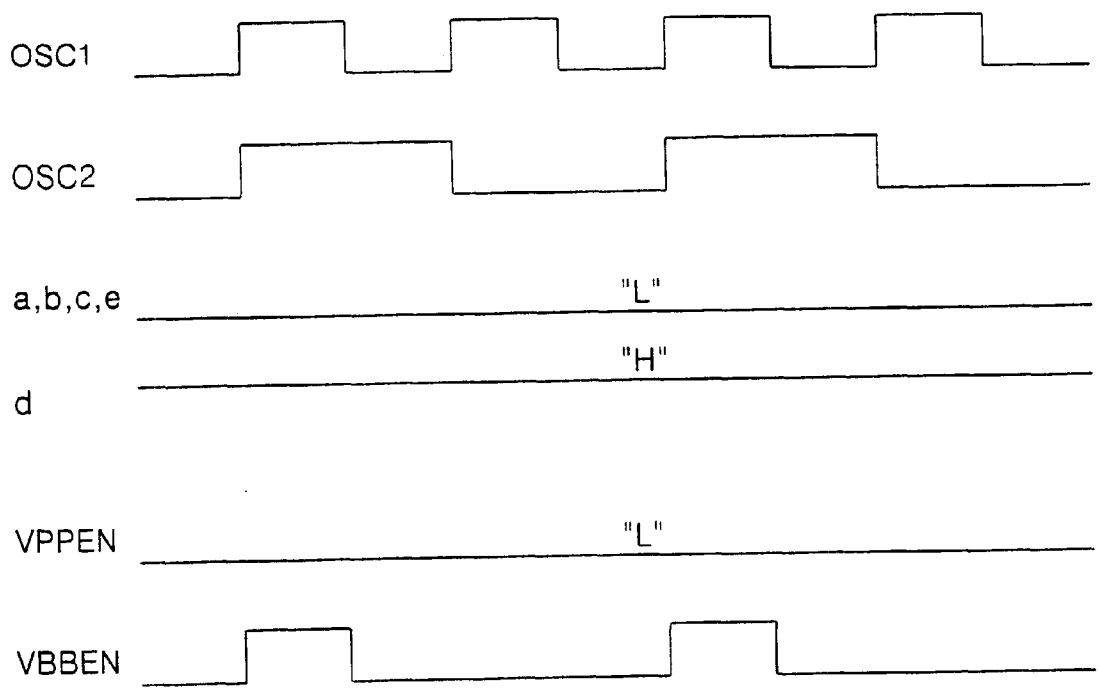

FIGS. 4A to 4C are timing diagrams to describe an operation of a control signal generating circuit, such as the circuit of FIG. 3, according to some embodiments of the present invention. In FIG. 4A, the high and the low voltage enable signals VPEN and VBEN have a logic "high" level. In FIG. 4B, the high voltage enable signal VPEN has a logic "high" level, and the low voltage enable signal VBEN has a logic "low" level. In FIG. 4C, the high voltage enable signal VPEN has a logic "low" level, and the low voltage enable signal VBEN has a logic "high" level.

Referring to FIG. 4A, when the high and the low voltage enable signals VPEN and VBEN go to a logic "high" level, the oscillating circuit 46 and the dividing circuit 48 operate to generate the pulse signals OSC1 and OSC2, and the NAND gate NA2 and the inverter I4 generate the signal "b" having a logic "high" level. At this moment, the signals "a" and "d" go to a logic "low" level. The NAND gate NA3 and the inverter I5 generate the signal "c" having the same phase as the pulse signal OSC2, and the NAND gate NA5 NANDs the signals "c" and OSC1. The NAND gate NA6 inverts an output signal of the NAND gate NA5. Consequently, the high voltage control signal VPPEN having a logic "high" level is generated when the signals "c" and "OSC1" have a logic "high" level. The NAND gate NA10 NANDs the signals "e" and "OSC1". The NAND gate NA11 inverts an output signal of the NAND gate NA10. Consequently, the low voltage control signal VBBEN having a logic "high" level is generated when the signals "e" and "OSC1" have a logic "high" level.

Referring to FIG. 4B, when the high voltage enable signal VPEN has a logic "high" level, and the low voltage enable signal VBEN has a logic "low" level, the oscillating circuit 46 and the dividing circuit 48 operate to generate the signal "a" having a logic "high" level. At this moment, the signals "b", "c", "d", and "e" have a logic "low" level. The NAND gate NA4 inverts the pulse signal OSC1 in response to the signal "a". The NAND gate NA6 inverts and outputs an output signal of the NAND gate NA5 in response to an output signal of the NAND gate NA4. Consequently, the high voltage control signal VPPEN having a logic "high" level is generated when the signals OSC1 and OSC2 have a logic "high" level. At this moment, the low voltage control signal VBBEN has a logic "low" level. Referring to FIG. 4C, when the high voltage enable signal VPEN has a logic "low" level, and the low voltage enable signal VBEN has a logic "high" level, the oscillating circuit 46 and the dividing circuit 48 operate to generate the pulse signals OSC1 and OSC2, and the NAND gate NA8 and the inverters I6 and I7 generate the signal "d" having a logic "high" level. At this moment, the signals "a", "b", "c", and "e" have a logic "low" level. The NAND gate NA9 inverts and outputs the signal OSC1 in response to the signal "d". The NAND gate NA11 inverts and outputs an output signal of the NAND gate NA9 in response to an output signal of the NAND gate NA10. Consequently, the low voltage control signal VBBEN having a logic "high" level is generated when the signals OSC1 and OSC2 have a logic "high" level. At this moment, the high voltage control signal VPPEN has a logic "low" level.

Figure 5:
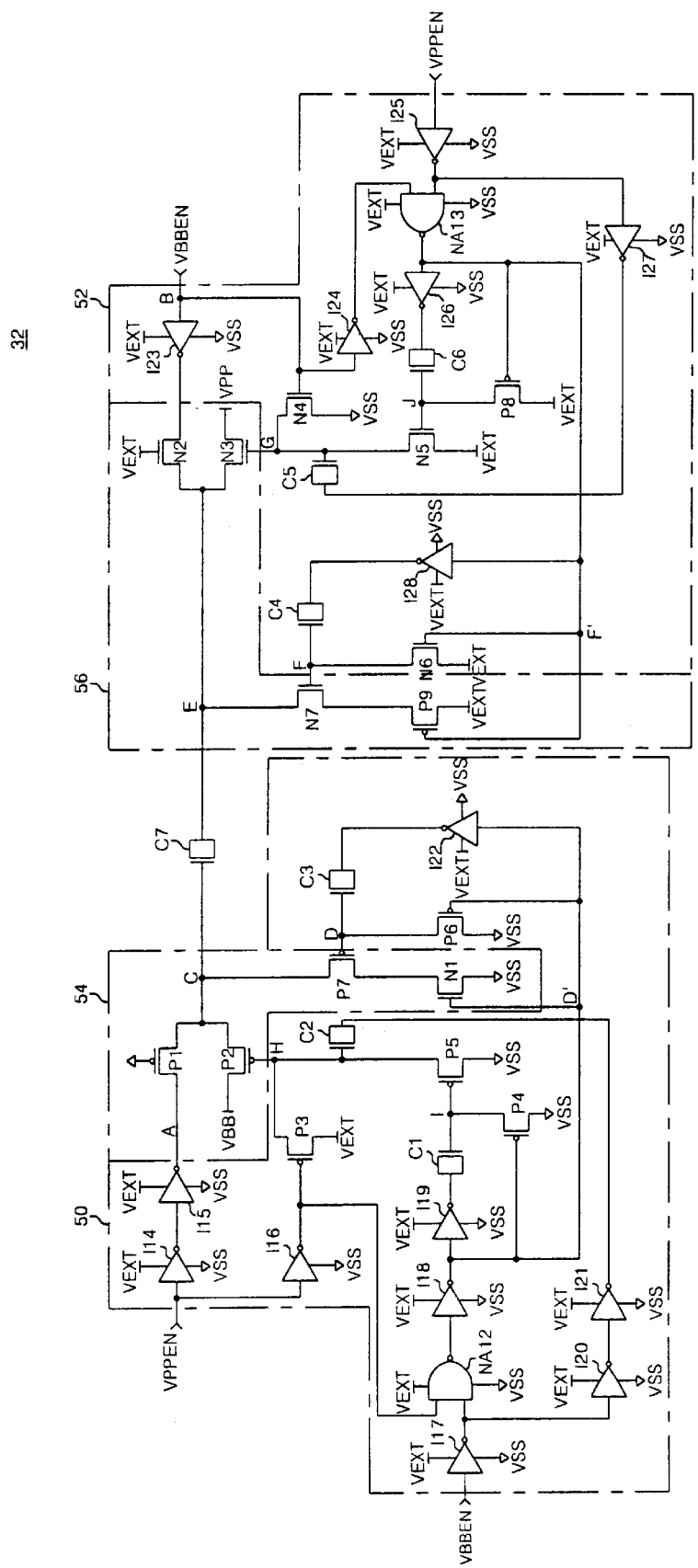
FIG. 5 is a circuit diagram illustrating a voltage generating circuit, such as may be used in FIG. 2, according to some embodiments of the present invention.

FIG. 5 is a circuit diagram illustrating a voltage generating circuit, such as may be used in FIG. 2, according to some embodiments of the present invention.

The voltage generating circuit of FIG. 5 includes a low voltage control signal generating circuit 50, a high voltage control signal generating circuit 52, a low voltage pumping circuit 54, a high voltage pumping circuit 56, and a pumping NMOS capacitor C7, also referred to as a shared capacitor, a pumping capacitor or a shared pumping capacitor.

The low voltage control signal generating circuit 50 includes inverters I14 to I22, PMOS transistors P3 to P6, NMOS capacitors C1 to C3, and a NAND gate NA12. The high voltage control signal generating circuit 52 includes inverters I23 to I28, a PMOS transistor P8, NMOS transistors N2 to N6, NMOS capacitors C4 to C6, and a NAND gate NA13. The low voltage pumping circuit 54 includes PMOS transistors P1, P2 and P7 and a NMOS transistor N1. The high voltage pumping circuit 56 includes NMOS transistors N2, N3 and N7 and a PMOS transistor P9. The pumping NMOS capacitor C7 is of larger capacitance than the NMOS capacitors C1 to C6.

The high and the low voltage control signals VPPEN and VBBEN have a level of the ground voltage VSS during a pre-charge operation. The inverters I14 and I15 buffer the high voltage control signal VPPEN having a level of the ground voltage VSS to generate a signal having a level of the ground voltage VSS to a node A. The inverter I16 inverts the signal having a level of the ground voltage VSS to generate a signal having a level of the external power voltage VEXT. As a result, the PMOS transistor P3 is turned off. The inverter I17 inverts the signal VBBEN having a level of the ground voltage VSS to generate a signal having a level of the external power voltage VEXT. The NAND gate NA12 and the inverter I18 generate a level having a level of the external power voltage VEXT. As a result, the PMOS transistor P4 is turned off. The inverter I19 inverts a signal having a level of the external power voltage VEXT to generate a signal having a level of the ground voltage VSS. The PMOS transistor P5 is turned on in response to a signal having a level of the ground voltage VSS of a node "x". The inverters I20 and I21 generate a signal having a level of the external power voltage VEXT.

The capacitor C2 pumps a node "H" in response to a signal having a level of the external power voltage VEXT. However, since the PMOS transistor P5 is turned on, the node H is maintained to a level of the ground voltage VSS. The NMOS transistor N1 is turned on in response to a signal having a level of the external power voltage VEXT of a node D'. The PMOS transistor P6 is turned off in response to a signal having a level of the external power voltage VEXT of the node D'. The inverter I22 inverts a voltage of the node D' to generate a signal having a level of the ground voltage VSS. The NMOS capacitor C3 pumps the node D to a level of a voltage−VEXT in response to a signal having a level of the ground voltage VSS. The PMOS transistor P7 is turned on in response to a signal of the node D. Therefore, a node C is maintained to a level of the ground voltage VSS.

The inverter I23 inverts the low voltage control signal VBBEN having a level of the ground voltage VSS to make a node B have a level of the voltage VEXT. The inverter I24 inverts the low voltage control signal VBBEN having a level of the ground voltage VSS to generate a signal having a level of the external power voltage VEXT. The NMOS transistor N4 is turned off in response to the low voltage control signal VBBEN having a level of the ground voltage VSS. The inverter I25 inverts the high voltage control signal VPPEN having a level of the ground voltage VSS to generate a level of the external power voltage VEXT. The NAND gate NA13 generates a signal having a level of the ground voltage VSS by NANDing output signals of the inverters I24 and I25.

The PMOS transistor P8 is turned on to make a node J have a level of the external power voltage VEXT in response to a signal having a level of the ground voltage VSS. The inverter I26 inverts a signal of the ground voltage VSS to generate a signal having a level of the external power voltage VEXT. The NMOS capacitor C6 makes the node J have a level of a voltage 2VEXT in response to a signal having a level of the external power voltage VEXT. Hence, the NMOS transistor N5 is turned on to transmit a signal having a level of the external power voltage VEXT to a node G.

The inverter I27 inverts an output signal of the inverter I25 to generate a signal having a level of the ground voltage VSS. The NMOS capacitor C5 lowers a level of the external power voltage VEXT of the node G in response to a signal having a level of the ground voltage VSS, but since the NMOS transistor N5 is turned on, the node G is maintained to a level of the external power voltage VEXT. The PMOS transistor P9 is turned on in response to a level of the ground voltage VSS of a node F'. The NMOS transistor N6 is turned off in response to a level of the ground voltage VSS of the node F'. The inverter I28 inverts a signal having a level of the ground voltage VSS to generate a signal having a level of the external power voltage VEXT. The NMOS capacitor C4 pumps the node F to a level of a voltage 2VEXT in response to a signal having a level of the external power voltage VEXT. Hence, the NMOS transistor N7 is turned on, and the node E is pre-charged to a level of the external power voltage VEXT.

That is, during a pre-charge operation, the nodes A, C, F', and H become a level of the ground voltage VSS, the nodes B, D', E, and G become a level of the external power voltage VEXT, the node D becomes a level of a voltage−VEXT, and the node F becomes a level of a voltage 2VEXT.

When the high voltage control signal VPPEN transitions to a level of the external power voltage VEXT, and the low voltage control signal VBBEN transitions to a level of the ground voltage VSS, the inverters I14 and I15 make the node A have a level of the external power voltage VEXT. A voltage of the node A is transmitted to the node C by the PMOS transistor P1. The inverter I16 inverts the high voltage control signal VPPEN to generate a signal having a level of the ground voltage VSS. The PMOS transistor P3 is turned on to make the node H have a level of the external power voltage VEXT in response to a signal having a level of the ground voltage VSS. The inverter I17 inverts a signal having a level of the ground voltage VSS to generate a signal having a level of the external power voltage VEXT. The NAND gate NA12 and the inverter I18 generate a signal having a level of the ground voltage VSS. The PMOS transistor P4 is turned on to make a node I have a level of the ground voltage VSS in response to a signal having a level of the ground voltage VSS. The inverter I19 inverts a signal having a level of the ground voltage VSS to generate a signal having a level of the external power voltage VEXT. The capacitor C1 makes the node I have a level of the external power voltage VEXT in response to a signal having a level of the external power voltage VEXT. The PMOS transistor P5 is turned off. The inverters I20 and I21 generate a signal having a level of the external power voltage VEXT. The capacitor C2 pumps and makes the node H have a level of the external power voltage VEXT in response to a signal having a level of the external power voltage VEXT. Accordingly, the PMOS transistor P2 is turned off.

The NMOS transistor N1 is turned off in response to a signal having a level of the ground voltage VSS of the node D', and the PMOS transistor P6 is turned on in response to a signal having a level of the ground voltage VSS, so that the signal of the node D becomes a level of the ground voltage VSS. The inverter I22 inverts a signal having a level of the ground voltage VSS of the node D' to generate a signal having a level of the external power voltage VEXT. The NMOS capacitor C3 pumps the node D to a level of the external power voltage VEXT in response to a signal having a level of the external power voltage VEXT, but since the PMOS transistor P6 is turned on, the node D is maintained to a level of the ground voltage VSS. Accordingly, the node C is maintained to a level of the external power voltage VEXT since the PMOS transistor P2 and the NMOS transistor N1 are turned off.

Each of the inverters I23 and I24 makes the node B have a level of the external power voltage VEXT in response to the low voltage control signal VBBEN having a level of the ground voltage VSS. A signal having a level of the external power voltage VEXT output from the inverter I23 is transmitted to the node E through the NMOS transistor N2. At this moment, since a voltage of the node C has a level of the external power voltage VEXT, a voltage of the node E becomes to a level of a voltage 2VEXT by the pumping capacitor C7. The NMOS transistor N4 is turned off in response to a signal having a level of the ground voltage VSS. The inverter I25 inverts the high voltage control signal VPPEN having a level of the external power voltage VEXT to generate a signal having a level of the ground voltage VSS. The NAND gate NA13 generates a signal having a level of the external power voltage VEXT by NANDing output signals of the inverters I24 and I25.

The PMOS transistor P8 is turned off in response to a signal having a level of the external power voltage VEXT. The inverter I26 inverts a signal having a level of the external power voltage VEXT to generate a signal having a level of the ground voltage VSS. The NMOS capacitor C6 pumps the node J in response to a signal having a level of the ground voltage VSS. The PMOS transistor P9 is turned on to make the node G have a level of the external power voltage VEXT in response to a signal of the node J. The inverter I27 inverts a signal having a level of the ground voltage VSS to generate a signal having a level of the external power voltage VEXT. The NMOS capacitor C5 pumps the node G to a voltage 2VEXT in response to a signal having a level of the external power voltage VEXT. The NMOS transistor N3 is turned on. The PMOS transistor P9 is turned off in response to a signal having a level of the external power voltage VEXT of the node F', and the NMOS transistor N5 is turned on in response to a level of the external power voltage VEXT of the node F', so that node F becomes a level of the external power voltage VEXT.

The inverter I28 inverts a signal having a level of the external power voltage VEXT to generate a signal having a level of the ground voltage VSS. The NMOS capacitor C4 lowers the node F to a level of the ground voltage VSS in response to a signal having a level of the ground voltage VSS. The NMOS transistor N7 is turned off. The NMOS transistor N1 and the PMOS transistor P2 are turned off, so that the node C is maintained to a level of the external power voltage VEXT. The PMOS transistor P9 is turned off, and the NMOS transistor N3 is turned on, so that a charge sharing operation is performed between the node E and a high voltage generating terminal at the beginning stage, so that a level of the node E decreases and thereafter is maintained to a level of the high voltage VPP.

The pre-charge operation and the high voltage generating operation described above are repeatedly performed to generate and maintain the high voltage VPP.

In a pre-charge state, when the high voltage control signal VPPEN is transited to a level of the ground voltage VSS, and the low voltage control signal VBBEN is transited to a level of the external power voltage VEXT, the inverters I14 and I15 make the node A have a level of the ground voltage VSS. A voltage of the node A is transmitted to the node C through the PMOS transistor P1. The inverter I16 inverts the high voltage control signal VPPEN to generate a signal having a level of the external power voltage VEXT. The PMOS transistor P3 is turned off in response to a signal having a level of the external power voltage VEXT. The inverter I17 inverts a signal having a level of the external power voltage VEXT to generate a signal having a level of the ground voltage VSS. The NAND gate NA12 and the inverter I18 generate a signal having a level of the ground voltage VSS. The PMOS transistor P4 is turned on a signal having a level of the ground voltage VSS to make the node I have a level of the ground voltage VSS.

The inverter I19 inverts a signal having a level of the ground voltage VSS to generate a signal having a level of the external power voltage VEXT. The capacitor C1 raises a level of the node I to a level of the external power voltage VEXT in response to a level of the external power voltage VEXT. The PMOS transistor P5 is turned off. The inverters I20 and I21 generate a signal having a level of the ground voltage VSS. The capacitor C2 pumps the node H to lower a level of the node H from a level of the ground voltage VSS to a level of a voltage−VEXT. In response to a signal of the node D' having a level of the ground voltage VSS, the NMOS transistor is turned off, and the PMOS transistor P6 is turned on. Accordingly, the node D becomes a level of the ground voltage VSS.

The inverter I22 inverts a signal of the node D' having a level of the external power voltage VEXT to generate a signal having a level of the external power voltage VEXT. The NMOS capacitor C3 pumps the node D to a level of the ground voltage VEXT in response to a signal having a level of the external power voltage VEXT, but since the PMOS transistor P6 is turned on, the node D is maintained to a level of the ground voltage VSS.

The inverters I23 and I24 invert the low voltage control signal VBBEN having a level of the external power voltage VEXT to generate a signal having a level of the ground voltage VSS, respectively. That is, the node B becomes a level of the ground voltage VSS, and a signal of the node B having a level of the ground voltage VSS is transmitted to the node E through the NMOS transistor N2. At this moment, since a voltage of the node E is a level of the ground voltage VSS, the voltage of the node C is lowered to a level of a voltage−VEXT by the pumping capacitor C7. At this moment, since the PMOS transistor P2 is turned on, a charge sharing operation is performed between the node C and the low voltage generating terminal VBB, and the node C is maintained to a level of the low voltage VBB after a charge sharing operation.

The NMOS transistor N4 is turned on in response to a signal having a level of the external power voltage VEXT to make the node G have a level of the ground voltage VSS. The inverter I25 inverts the high voltage control signal VPPEN having a level of the ground voltage VSS to generate the external power voltage VEXT. The NAND gate NA13 generates a signal having a level of the external power voltage VEXT by NANDing output signals of the inverters I24 and I25. The PMOS transistor P8 is turned off in response to a signal having a level of the external power voltage VEXT.

The inverter I26 inverts a signal having a level of the external power voltage VEXT to generate a signal having a level of the ground voltage VSS. The NMOS capacitor C6 lowers a level of the node J in response to a signal having a level of the ground voltage VSS. Therefore, the NMOS transistor N5 is turned off. The inverter I27 generates a signal having a level of the ground voltage VSS. The NMOS capacitor C5 lowers a level of the node G in response to a signal having a level of the ground voltage VSS, but since the NMOS transistor N4 is turned on, a level of the node G is maintained to a level of the ground voltage VSS, and the NMOS transistor N3 is turned off. The PMOS transistor P9 is turned off in response to a signal of the node F' having a level of the external power voltage VEXT, and the NMOS transistor N6 is turned on, so that the node F becomes a level of the external power voltage VEXT.

The inverter I28 inverts a signal having a level of the external power voltage VEXT to generate a signal having a level of the ground voltage VSS. The NMOS capacitor C4 lowers a level of the node F in response to a signal having a level of the ground voltage VSS, but since the NMOS transistor N6 is turned on, the node F is maintained to a level of the external power voltage VEXT. Therefore, the NMOS transistor N3 and the PMOS transistor P9 are turned off so that the node E is maintained to a level of the ground voltage VSS, and the NMOS transistor N1 is turned off, so that a voltage of the node C is transmitted to the low voltage generating terminal through the PMOS transistor P2.

The pre-charge operation and the low voltage generating operation described above are repeatedly performed to generate and maintain the low voltage VBB.

Voltage generating circuits according to some embodiments of the invention can generate the high voltage and the low voltage using one pumping capacitor C7. Thus, a layout area size can be significantly reduced, according to some embodiments of the invention. The high voltage and the low voltage are generated by using one pumping capacitor rather than two pumping capacitors for the high voltage and the low voltage, respectively. The layout area size in the integrated circuit substrate can be reduced, according to some embodiments of the invention.

Figure 6A:
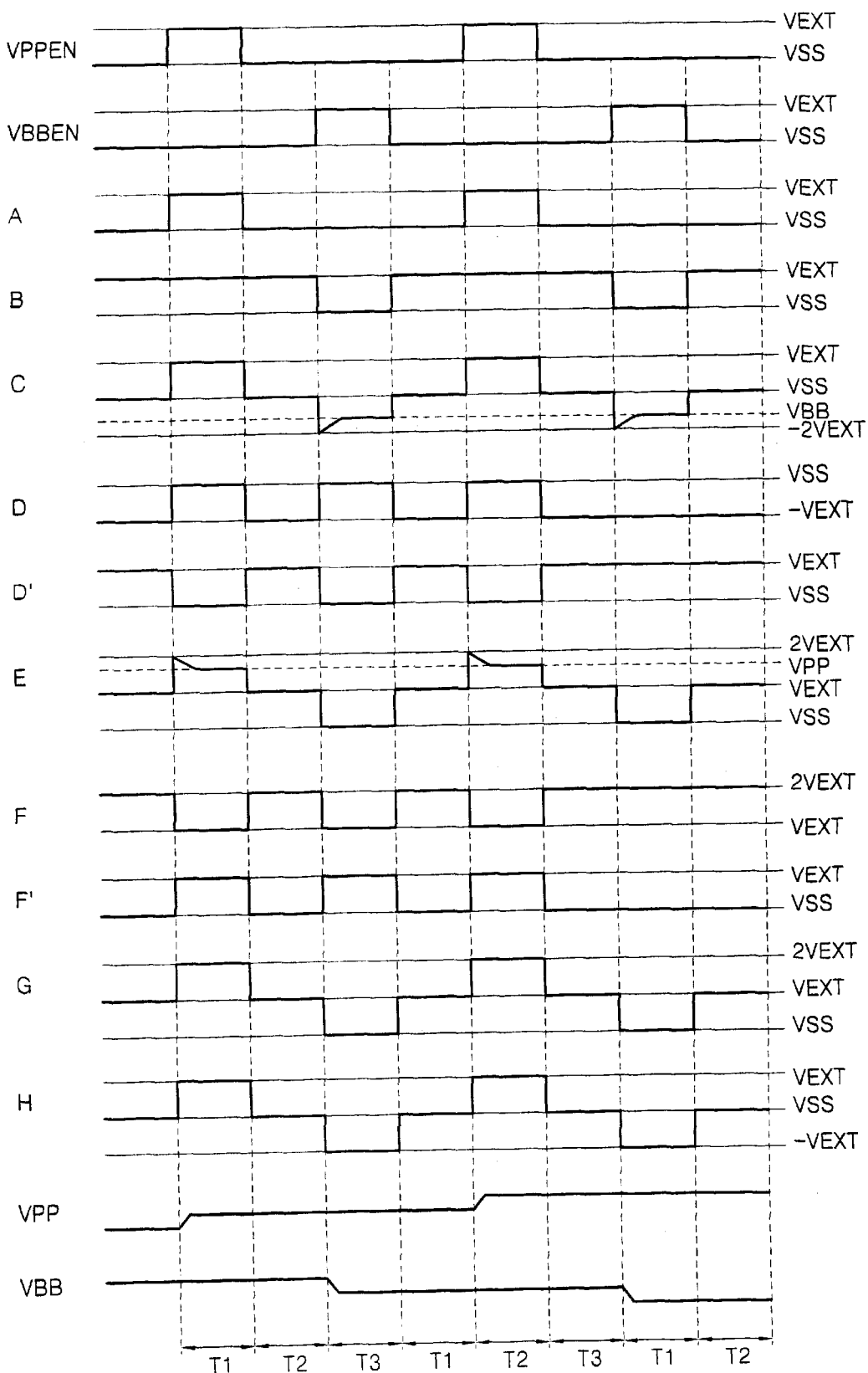
FIGS. 6A–6C are timing diagrams describing an operation of a voltage generating circuit, such as the circuit of FIG. 5, according to some embodiments of the present invention.
Figure 6B:
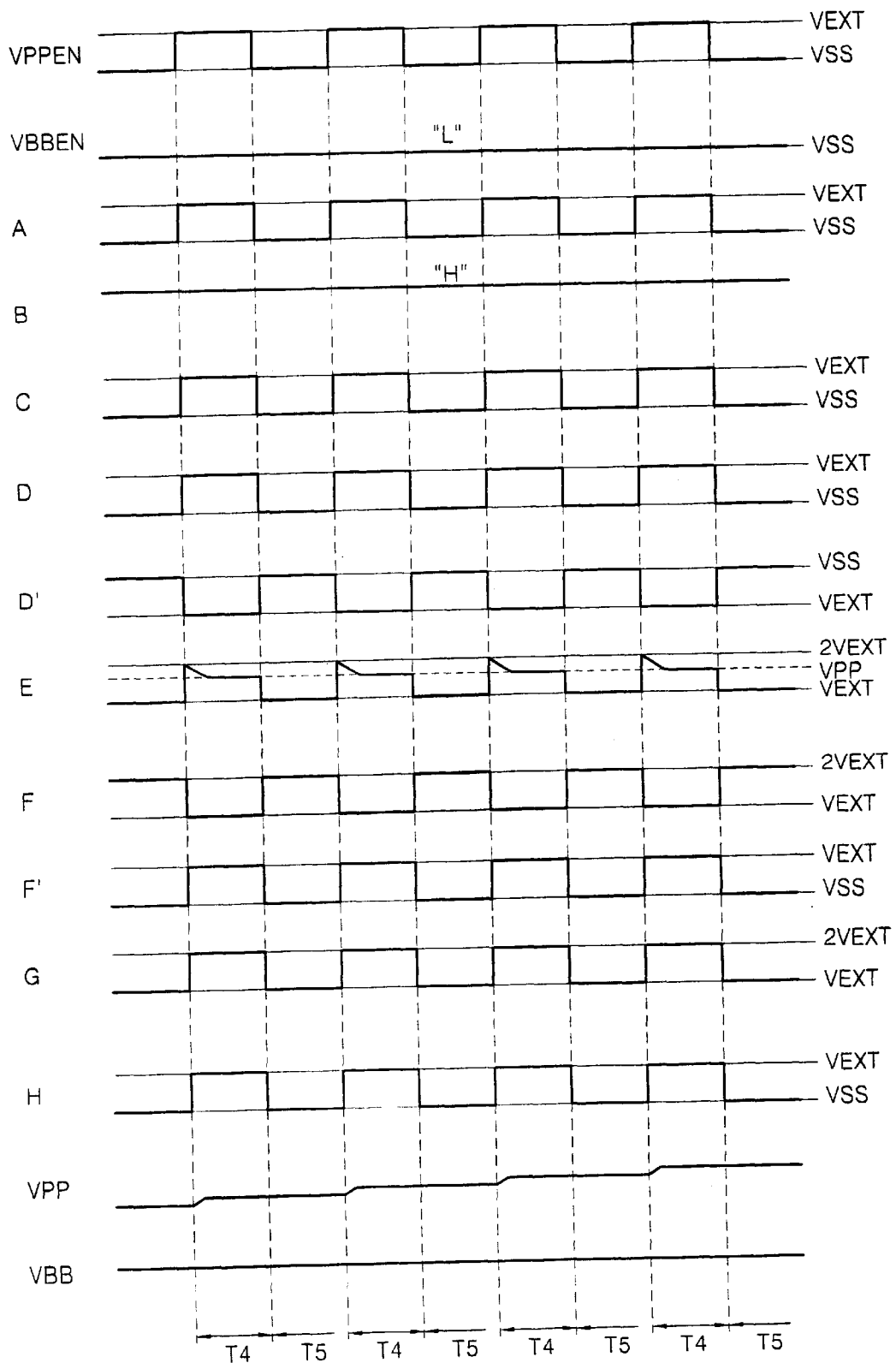
Figure 6C:
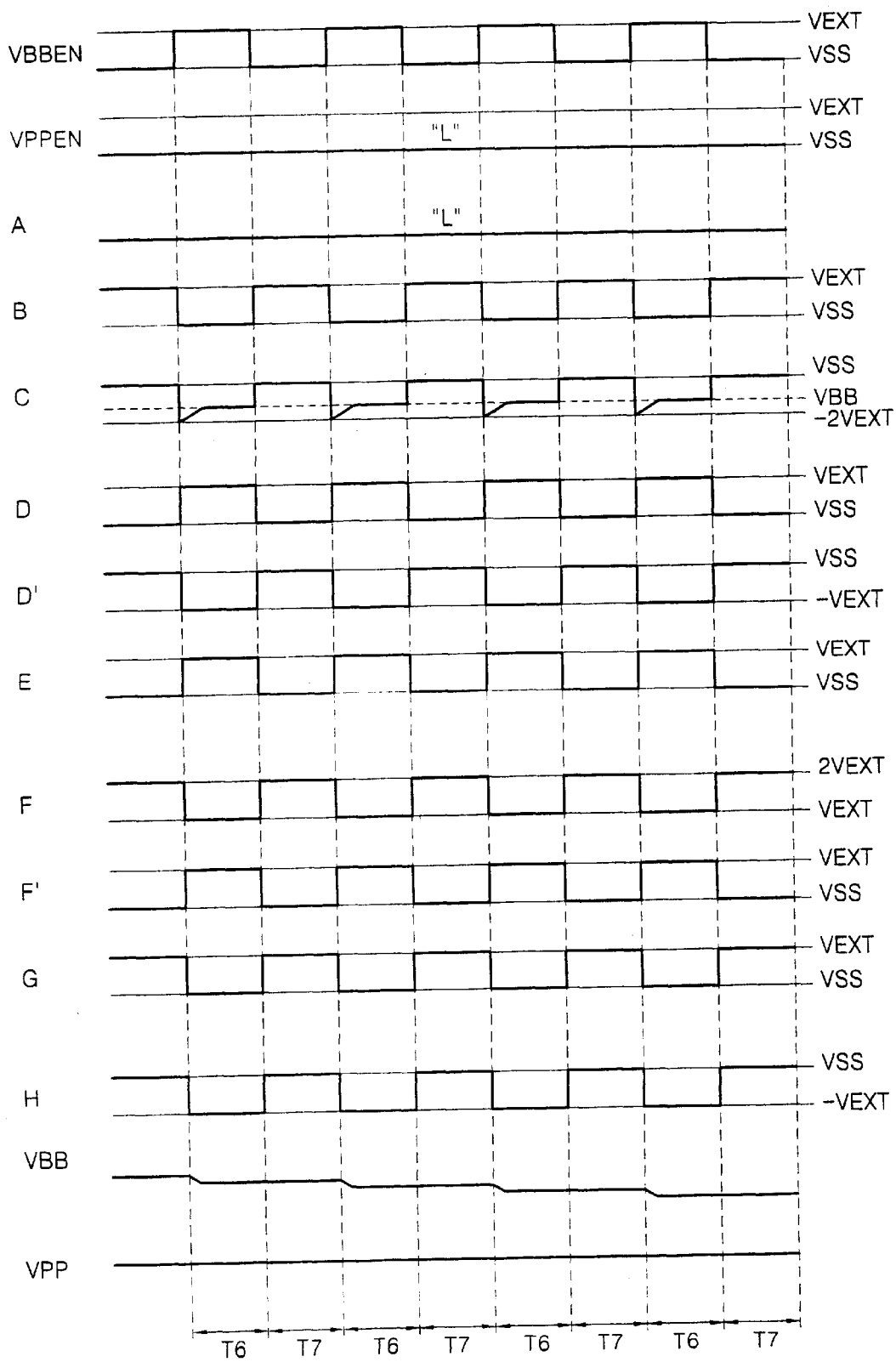

FIGS. 6A to 6C are timing diagrams to describe an operation of a voltage generating circuit, such as illustrated in FIG. 5. In FIG. 6A, both the high voltage VPPEN and the low voltage control signal VBBEN are toggled interleavingly. In FIG. 6B, the high voltage control signal VPPEN is toggled, but the low voltage control signal VBBEN is not generated. In FIG. 6C, the high voltage control signal VPPEN is not generated, but the low voltage control signal VBBEN is toggled. In FIGS. 6A to 6C, A–H, D', and F' denote signals of respective nodes of FIG. 5.

Referring to FIG. 6A, during a time period T1 that the high voltage control signal VPPEN has a level of the external power voltage VEXT and the low voltage control signal VBBEN has a level of the ground voltage VSS, the nodes A, B and C have a level of the external power voltage VEXT, and the node E is stepped up. At this moment, the nodes D and D' have a level of the ground voltage VSS, and a voltage of the node H has a level of the external power voltage VEXT. Therefore, since the PMOS transistor P2 is turned off, and the NMOS transistor N1 is turned off, the node C is maintained to a level of the external power voltage VEXT. The nodes F and F' have a level of the external power voltage VEXT, and the node G has a level of a voltage 2VEXT. Therefore, since the PMOS transistor P10 is turned off and the NMOS transistor N3 is turned on, the voltage 2VEXT of the node F is transmitted to the high voltage generating terminal and is maintained to the high voltage VPP after a charge sharing operation.

Thereafter, during a time period T2 that the high voltage control signal VBBEN and the low voltage control signal VPPEN have a level of the ground voltage VSS, the nodes A, C, F', and H become a level of the ground voltage VSS, the nodes B, D', E, and G become a level of the external power voltage VEXT, the node D becomes a level of a voltage–VEXT, and the node F becomes a level of a voltage 2VEXT. Hence, the NMOS transistor N1 and the PMOS transistor P7 are turned on, so that the node C is maintained to a level of the ground voltage VSS. The NMOS transistor N6 and the PMOS transistor N10 are turned on, so that the node E is maintained to a level of the external power voltage VEXT. At this moment, the PMOS transistor P2 and the NMOS transistor N3 are turned off, so that a current does not flow between the nodes C and E and the low and the high voltage generating terminals. That is, the nodes of the voltage generating circuit remain pre-charged.

Thereafter, during a time period T3 that the high voltage control signal VPPEN has a level of the ground voltage VSS and the low voltage control signal VBBEN has a level of the external power voltage VEXT, the nodes A, B, C, D, D', E, and G become a level of the ground voltage VSS, the nodes F and F' become a level of the external power voltage VEXT, and the node H becomes a level of a voltage–VEXT. Hence, the NMOS transistors N1 and N3 and the PMOS transistor P10 are turned off, the PMOS transistor P2 is turned on, and a voltage of the node E is lowered to a level of the ground voltage VSS, whereupon a voltage of the node C is lowered to a level of a voltage –2VEXT. At this moment, since the PMOS transistor P2 is turned on, a voltage of the node C stepped down is transmitted to the low voltage generating terminal, and a charge sharing operation is performed, so that the low voltage VBB is generated.

The high voltage VPP and the low voltage VBB are interleavingly pumped such that the high voltage generating operation, the pre-charge operation and the low voltage generating operation are repeatedly performed by interleavingly toggling the high voltage control signal VPPEN and the low voltage control signal VBBEN.

Referring to FIG. 6B, during a time period T4 that the high voltage control signal VPPEN has a level of the external power voltage VEXT and the low voltage control signal VBBEN has a level of the ground voltage VSS, the same operation as performed during the time period T1 of FIG. 6A is performed.

During a pre-charge time period T5 that the high voltage control signal VPPEN and the low voltage control signal VBBEN have a level of the ground voltage VSS, the same operation as performed during the pre-charge time period T2 of FIG. 6A is performed.

That is, the high voltage VPP is generated and maintained such that the high voltage control signal VPPEN is toggled and the low voltage control signal VBBEN is maintained to a level of the ground voltage VSS, and the high voltage generating operation and the pre-charge operation are repeatedly performed.

Referring to FIG. 6C, during a low voltage generating time period T6, the high voltage control signal VPPEN has a level of the ground voltage VSS and the low voltage control signal VBBEN is toggled, and the same operation as performed during the time period T3 of FIG. 6A is performed.

During a pre-charge time period T7 that the high voltage control signal VPPEN and the low voltage control signal VBBEN have a level of the ground voltage VSS, the same operation as performed during the time period T2 of FIG. 6A is performed.

That is, the low voltage VBB is generated and maintained such that the low voltage control signal VBBEN is toggled and the high voltage control signal VPPEN is maintained to a level of the ground voltage VSS, and the low voltage generating operation and the pre-charge operation are repeatedly performed.

As described above, the voltage generating circuit according to some embodiments of the present invention can generate the high voltage and the low voltage using one pumping capacitor, thereby reducing a layout area size.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A voltage generating circuit, comprising:

means for generating high and low voltage control signals for interleavingly toggling high and low voltage enable signals when the high and the low enable signals are all enabled, for generating the high voltage control signal for toggling the high voltage enable signal when the high voltage enable signal is enabled, and for generating the low voltage control signal for toggling the low voltage enable signal when the low voltage enable signal is enabled; and means for pre-charging high and low voltage pumping nodes during a pre-charge operation in response to the high and the low voltage control signals, respectively, for pumping a pumping capacitor connected between the high and the low pumping nodes to generate a low voltage during a low voltage generating operation in response to the low voltage control signal, and for pumping the pumping capacitor to generate a high voltage during a high voltage generating operation in response to the high voltage control signal.

2. The circuit of claim 1, wherein the means for generating high and low voltage control signals comprises:

means for ORing the high and the low voltage enable signals;

means for generating a first pulse signal in response to an output signal of the means for ORing;

means for dividing the first pulse signal into two signals to generate a second pulse signal;

means for generating the high voltage control signal by ANDing the first and the second pulse signals when the high and the low voltage enable signals are all enabled, and for generating the high voltage control signal by using the first pulse signal when the high voltage enable signal is enabled and the low voltage control signal is disabled; and means for generating the low voltage control signal by ANDing inverted signals of the first and the second pulse signals when the high and the low voltage enable signals are all enabled, and for generating the low voltage control signal by using the first pulse signal when the low voltage enable signal is enabled and the high voltage control signal is disabled.

3. The circuit of claim 1, wherein the means for pre-charging high and low voltage pumping nodes comprises:

means for generating a low voltage generating control signal and sending same to a low voltage generating control node in response to the high voltage control signal and for generating first and second pre-charge control signals respectively applied to first and second pre-charge nodes by combining the high and the low voltage control signals;

means for generating a high voltage generating control signal and sending same to a high voltage generating control node in response to the low voltage control signal and for generating third and fourth pre-charge control signals respectively applied to third and fourth pre-charge nodes by combining the high and the low voltage control signals;

means for pre-charging the low voltage pumping node in response to the first and the second pre-charge control signals during the pre-charge operation, for transmitting a voltage of the low voltage pumping node to a low voltage generating terminal in response to the low voltage control signal during the low voltage generating operation, and for pumping the high voltage by pumping the pumping capacitor in response to the low voltage control signal during the high voltage generating operation; and means for pre-charging the high voltage pumping node in response to the third and the fourth pre-charge control signals during the pre-charge operation, for transmitting a voltage of the high voltage pumping node to a high voltage generating terminal in response to the high voltage control signal during the high voltage generating operation, and for pumping the low voltage by pumping the pumping capacitor in response to the high voltage control signal during the low voltage generating operation.

4. The circuit of claim 3, wherein the means for pre-charging the low voltage pumping node comprises:

means for applying a first power voltage to the low voltage pumping node by being turned on in response to the first and the second pre-charge control signals during the pre-charge operation, and for blocking a flow of a current between the low voltage pumping node and the first power voltage by being turned off during the high and the low voltage generating operations;

means for transmitting the high voltage control signal to the low voltage pumping node; and means for blocking a flow of a current between the low voltage pumping node and the low voltage generating terminal by being turned off during the pre-charge operation and the high voltage generating operation, and for stepping down a voltage of the low voltage generating terminal by transmitting a voltage of the low voltage pumping node to the low voltage generating terminal by being turned on during the low voltage generating operation.

5. The circuit of claim 3, wherein the means for pre-charging high voltage pumping node comprises:

means for applying a second power voltage to the high voltage pumping node by being turned on in response to the third and the fourth pre-charge control signals during the pre-charge operation, and for blocking a flow of a current between the high voltage pumping node and the second power voltage by being turned off during the high and the low voltage generating operations;

means for transmitting an inverted signal of the low voltage control signal to the high voltage pumping node; and means for blocking a flow of a current between the high voltage pumping node and the low voltage generating terminal by being turned off during the pre-charge operation and the low voltage generating operation, and for stepping up a voltage of the high voltage generating terminal by transmitting a voltage of the high voltage pumping node to the high voltage generating terminal by being turned on during the high voltage generating operation.

6. A voltage generating circuit, comprising:

means for generating high and low voltage control signals for interleavingly toggling high and low voltage enable signals when the high and the low voltage enable signals are all enabled, for generating the high voltage control signal for toggling the high voltage enable signal when the high voltage enable signal is enabled, and for generating the low voltage control signal for toggling the low voltage enable signal when the low voltage enable signal is enabled;

means for generating a low voltage generating control signal and sending same to a low voltage generating control node in response to the high voltage control signal and for generating first and second pre-charge control signals respectively applied to first and second pre-charge nodes by combining the high and the low voltage control signals;

means for generating a high voltage generating control signal and sending same to a high voltage generating control node in response to the low voltage control signal and for generating third and fourth pre-charge control signals respectively applied to third and fourth pre-charge nodes by combining the high and the low voltage control signals;

means for pre-charging the low voltage pumping node in response to the first and the second pre-charge control signals during the pre-charge operation, for transmitting a voltage of the low voltage pumping node to a low voltage generating terminal in response to the low voltage control signal during the low voltage generating operation, and for pumping the high voltage by pumping the pumping capacitor in response to the low voltage control signal during the high voltage generating operation; and means for pre-charging the high voltage pumping node in response to the third and the fourth pre-charge control signals during the pre-charge operation, for transmitting a voltage of the high voltage pumping node to a high voltage generating terminal in response to the high voltage control signal during the high voltage generating operation, and for pumping the low voltage by pumping the pumping capacitor in response to the high voltage control signal during the low voltage generating operation.

7. The circuit of claim 6, wherein the means for generating high and low voltage control signals comprises:

means for ORing the high and the low voltage enable signals;

means for generating a first pulse signal in response to an output signal of the means for ORing;

means for dividing the first pulse signal into two signals to generate a second pulse signal;

means for generating the high voltage control signal by ANDing the first and the second pulse signals when the high and the low voltage enable signals are all enabled, and for generating the high voltage control signal by using the first pulse signal when the high voltage enable signal is enabled and the low voltage control signal is disabled; and means for generating the low voltage control signal by ANDing inverted signals of the first and the second pulse signals when the high and the low voltage enable signals are all enabled, and for generating the low voltage control signal by using the first pulse signal when the low voltage enable signal is enabled and the high voltage control signal is disabled.

8. The circuit of claim 6, wherein the means for pre-charging the low voltage pumping node comprises:

means for applying a first power voltage to the low voltage pumping node by being turned on in response to the first and the second pre-charge control signals during the pre-charge operation, and for blocking a flow of a current between the low voltage pumping node and the first power voltage by being turned off during the high and the low voltage generating operations;

means for transmitting the high voltage control signal to the low voltage pumping node; and means for blocking a flow of a current between the low voltage pumping node and the low voltage generating terminal by being turned off during the pre-charge operation and the high voltage generating operation, and for stepping down a voltage of the low voltage generating terminal by transmitting a voltage of the low voltage pumping node to the low voltage generating terminal by being turned on during the low voltage generating operation.

9. The circuit of claim 6, wherein the means for pre-charging the high voltage pumping node comprises:

means for applying a second power voltage to the high voltage pumping node by being turned on in response to the third and the fourth pre-charge control signals during the pre-charge operation, and blocking a flow of a current between the high voltage pumping node and the second power voltage by being turned off during the high and the low voltage generating operations;

means for transmitting an inverted signal of the low voltage control signal to the high voltage pumping node; and means for blocking a flow of a current between the high voltage pumping node and the low voltage generating terminal by being turned off during the pre-charge operation and the low voltage generating operation, and for stepping up a voltage of the high voltage generating terminal by transmitting a voltage of the high voltage pumping node to the high voltage generating terminal by being turned on during the high voltage generating operation.

10. A voltage generating method, comprising:

stepping up a voltage of a high voltage pumping node by pumping a pumping capacitor connected between the high voltage pumping node and a low voltage pumping node in response to a high voltage control signal during a high voltage generating operation;

pre-charging the high and the low voltage pumping nodes, respectively, during a pre-charge operation; and stepping down a voltage of the low voltage pumping node by pumping the pumping capacitor in response to a low voltage control signal during a low voltage generating operation, and transmitting a voltage of the low voltage pumping node to a low voltage generating terminal.

11. The method of claim 10, wherein the stepping up further comprises stepping up the low voltage pumping node in response to the high voltage control signal and maintaining the stepped-up level during the high voltage generating operation.

12. The method of claim 10, wherein a current does not flow between the high voltage pumping node and the high voltage generating terminal, and between the low voltage pumping node and the low voltage generating terminal, during the pre-charging.

13. The method of claim 10, wherein the stepping down further comprises stepping down the high voltage pumping node in response to the low voltage control signal and maintaining the stepped-down level during the low voltage generating operation.

14. A voltage generating method, comprising:

stepping up a voltage of a high voltage pumping node by pumping a pumping capacitor connected between the high voltage pumping node and a low voltage pumping node in response to a high voltage control signal during a high voltage generating operation, and transmitting the voltage of the high voltage pumping node to a high voltage generating terminal;

pre-charging the high and the low voltage pumping nodes, respectively, during a pre-charge operation; and repeatedly performing the stepping up and the pre-charging.

15. A voltage generating method, comprising:

stepping down a voltage of the low voltage pumping node by pumping the pumping capacitor in response to a low voltage control signal during a low voltage generating operation, and transmitting a voltage of the low voltage pumping node to a low voltage generating terminal;

pre-charging the high and the low voltage pumping nodes, respectively, during a pre-charge operation; and repeatedly performing the stepping down and the pre-charging.

16. An integrated circuit voltage generating circuit, comprising:

an integrated circuit substrate;

a first voltage generating circuit in the integrated circuit substrate that is configured to generate a first voltage from a power supply voltage;

a second voltage generating circuit in the integrated circuit substrate that is configured to generate a second voltage that is different from the first voltage from the power supply voltage; and a shared capacitor in the integrated circuit substrate that is connected to both the first voltage generating circuit and to the second voltage generating circuit and that is used by the first voltage generating circuit and the second voltage generating circuit to generate the first and second voltages, respectively.

17. The integrated circuit voltage generating circuit according to claim 16 wherein the first voltage generating circuit includes a first transistor and generates the first voltage at a first node, wherein the second voltage generating circuit includes a second transistor and generates the second voltage at a second node and wherein the first transistor, the shared capacitor and the second transistor are serially connected between the first node and the second node.

18. The integrated circuit voltage generating circuit according to claim 16 in combination with a memory cell array in the integrated circuit substrate that operates from the power supply voltage, the first voltage and the second voltage.

19. The integrated circuit voltage generating circuit according to claim 16 wherein the first voltage generating circuit includes a plurality of capacitors and wherein the shared capacitor has larger capacitance than any of the plurality of capacitors.

20. The integrated circuit voltage generating circuit according to claim 16 wherein the first voltage is of opposite polarity than the power supply voltage and wherein the second voltage is of same polarity as, but greater than, the power supply voltage.

21. An integrated circuit voltage generating circuit, comprising:

an integrated circuit substrate;

a first voltage generating circuit in the integrated circuit substrate that is configured to generate a first voltage from a power supply voltage; and a second voltage generating circuit in the integrated circuit substrate that is configured to generate a second voltage that is different from the first voltage from the power supply voltage;

wherein the first voltage generating circuit and the second voltage generating circuit has at least one shared capacitor, respectively, which is shared by the first voltage generating circuit and the second voltage generating circuit.

* * * * *